(12) United States Patent
Doherty et al.

(10) Patent No.: US 8,749,032 B2
(45) Date of Patent: Jun. 10, 2014

(54) INTEGRATED CIRCUIT WITH IMPROVED TRANSMISSION LINE STRUCTURE AND ELECTROMAGNETIC SHIELDING BETWEEN RADIO FREQUENCY CIRCUIT PATHS

(75) Inventors: Mark Doherty, Westford, MA (US); Michael McPartlin, North Andover, MA (US); Chun-Wen Paul Huang, Methuen, MA (US)

(73) Assignee: SiGe Semiconductor, Inc., Ottawa (CA)

( * ) Notice: Subject to any disclaimer, the term of this patent is extended or adjusted under 35 U.S.C. 154(b) by 366 days.

(21) Appl. No.: 12/628,324

(22) Filed: Dec. 1, 2009

(65) Prior Publication Data

US 2010/0140758 A1 Jun. 10, 2010

Related U.S. Application Data

(60) Provisional application No. 61/120,330, filed on Dec. 5, 2008.

(51) Int. Cl.
*H01L 23/552* (2006.01)

(52) U.S. Cl.
USPC ..... 257/659; 257/728; 257/921; 257/E23.114

(58) Field of Classification Search
USPC .......... 257/659, 660, 774, 728, 921, E23.114
See application file for complete search history.

(56) References Cited

U.S. PATENT DOCUMENTS

| 3,986,196 A | 10/1976 | Decker et al. | |
|---|---|---|---|
| 4,348,253 A | 9/1982 | Subbarao et al. | |
| 5,528,080 A | 6/1996 | Goldstein | |
| 5,592,391 A | 1/1997 | Muyshondt et al. | |
| 7,151,011 B2 | 12/2006 | Sridharan et al. | |
| 7,427,803 B2 * | 9/2008 | Chao et al. | 257/659 |
| 7,999,358 B2 * | 8/2011 | Bakalski et al. | 257/659 |
| 2010/0078777 A1 * | 4/2010 | Barth et al. | 257/659 |
| 2010/0078778 A1 * | 4/2010 | Barth et al. | 257/659 |
| 2010/0078779 A1 * | 4/2010 | Barth et al. | 257/659 |

* cited by examiner

*Primary Examiner* — Eduardo A Rodela
(74) *Attorney, Agent, or Firm* — Knobbe, Martens, Olson & Bear, LLP

(57) ABSTRACT

An integrated circuit is disclosed having through silicon vias spaced apart one from another and conductors, each coupled to one or more of the through silicon vias, the conductors in aggregate in use forming a segmented conductive plane maintained at a same potential and forming an electromagnetic shield.

22 Claims, 10 Drawing Sheets

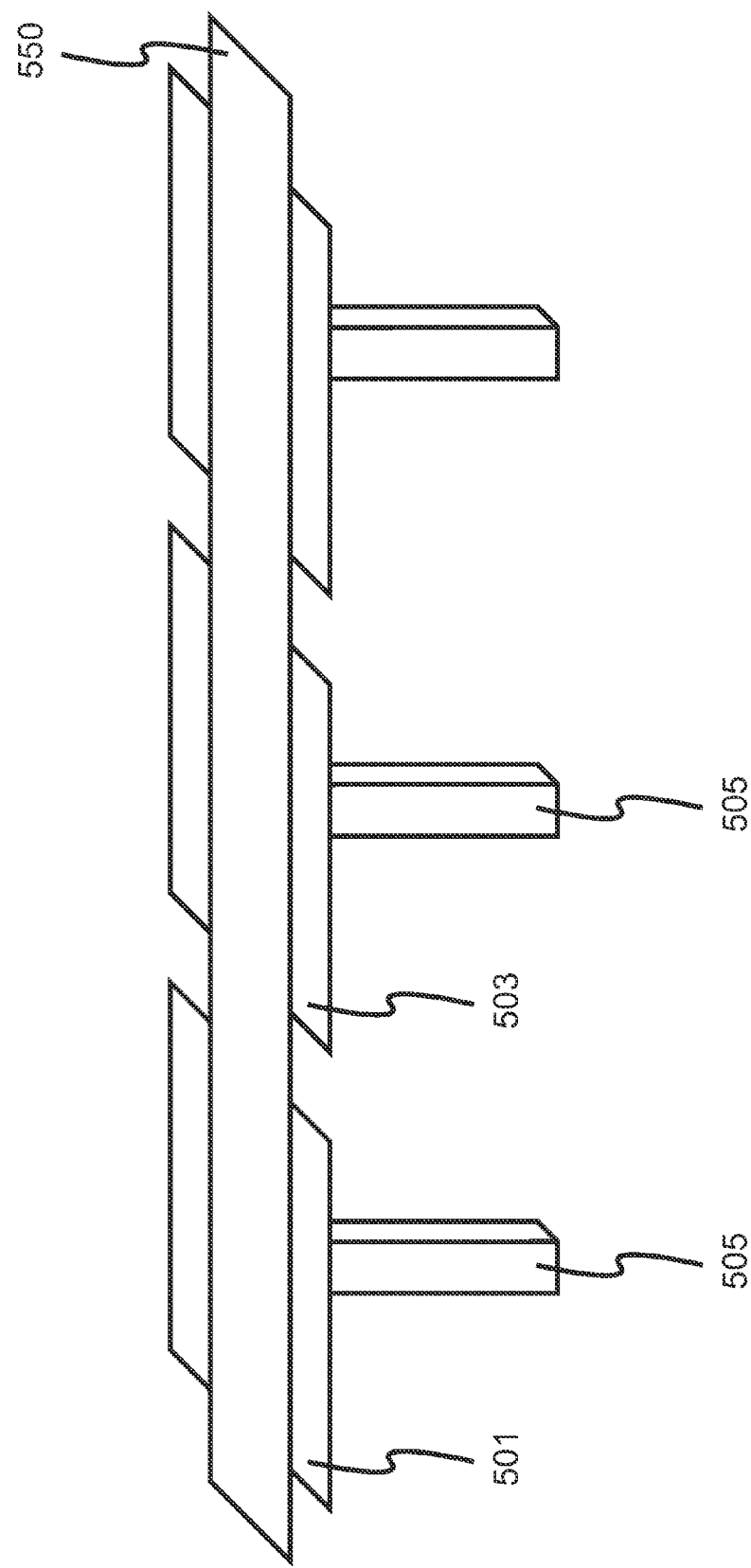

INTEGRATED CIRCUIT WITH IMPROVED TRANSMISSION LINE STRUCTURE AND ELECTROMAGNETIC SHIELDING BETWEEN RADIO FREQUENCY CIRCUIT PATHS

RELATED APPLICATION

This application claims priority to U.S. Application No. 61/120,330, filed Dec. 5, 2008, the disclosure of which is incorporated by reference in its entirety for all purposes.

FIELD OF THE INVENTION

The present specification relates generally to integrated circuits (ICs). More specifically, the present specification relates to integrated circuits having improved transmission line structures and internal electromagnetic shielding properties.

BACKGROUND

Integrated circuit (IC) packages generally contain integrated circuit chips or die-containing densely packed circuits. Electronic circuits placed in close proximity to each other on an integrated circuit die can cause electromagnetic interference. That is, the electric signals, whether intentional or not (noise), can propagate to an adjacent or remote circuit element on the same die and interfere with the operation of that circuit or superimpose upon the signal being generated in the adjacent or remote circuit element. As circuit miniaturization progresses, interference between circuits within a same integrated circuit die sometimes occurs. Moreover, as those circuits get closer and closer, the problem becomes more common place especially in the context of high performance RF or analog signals where signal fidelity is of great importance. The substrate of the die hosting the circuit can, in fact, serve as a conduit for the passage of noise.

In the area of analogue signal amplification and conditioning this is an important concern. As the power of a signal generated and propagating within an IC increases, its ability to cause noise in other signals also increases. Whereas for digital circuits this noise may be manageable, in analogue circuitry, noise is considered highly undesirable. It is therefore desirous to prevent circuits within an integrated circuit from unintentionally dispersing signals into adjacent circuits within a same die.

A transmission line can be considered an adjacent or remote circuit that can be compromised by the presence of noise in the underlying substrate. A transmission line must be isolated from the effect of the signals and/or noise generated in the adjacent circuits sharing the same die in order to preserve the signal on the transmission line. Having a means to suppress the addition of noise signals onto the intended transmission line signal is highly desirable especially in the context of circuits which feature power amplifier stages adjacent to analog or RF signal receivers.

The interference problem is a particular problem at high frequencies (HF) and radio frequencies (RF), though electromagnetic interference between circuits on an integrated circuit can also be a problem at lower frequencies. Radiation or other energy is often disbursed by substrate coupling, through common ground, through common power supplies or through transmission line effects.

Heretofore, electromagnetic interference between circuitry has been prevented by limiting the number of systems or circuits on a chip or die. Each die or chip is generally associated with a single circuit that is a source or is sensitive to electromagnetic radiation. Typically, each chip is packaged and that package may be externally shielded, such as, in a Faraday cage.

Limiting the number of circuits on the chip, however, increases costs of the entire system because the system must then employ more chips to achieve the same functionality. In addition, the use of individual Faraday cages for each package may increase the cost of the system. Furthermore, shielding each chip also increases manufacturing and assembly costs along with the fact that the entire size of the system is increased by the increased number of packaged chips and the external Faraday shielding.

An example of conventional electromagnetic shielding techniques is disclosed in U.S. Pat. No. 5,986,340, which describes a ball grid array (BGA) package. The package includes an external Faraday cage formed around the integrated circuit die. The external Faraday cage is comprised of a heat sink surrounding the integrated circuit die and a metal plate on an upper peripheral surface of the heat sink.

U.S. Pat. No. 5,986,340 is similar to U.S. Pat. No. 5,955,789 and discloses a plastic ball grid array (BGA) electronic package in a cavity down configuration. The package includes an active element mounted on a package substrate and is for use in HF applications. An external Faraday cage is realized to protect the active element from external HF interferences. A row of solder balls connected in a zig-zag fashion on a bottom of the package substrate and plated-through holes through the package substrate form lateral sides of the external Faraday cage. The top-side of the external Faraday cage is formed of a metal cap and the bottom side of the external Faraday cage is formed by a ground plane of the main board. The package in U.S. Pat. No. 5,955,789, however, does not provide shielding within the integrated circuit (IC) die.

U.S. Pat. No. 7,151,011 teaches a method of forming a Faraday cage partially integrated within an integrated circuit using vias as a set of vertical bars forming a cage with a solid roof and floor to shield a portion of the circuit from an inductive element on the top metal layer of the integrated circuit. For example, the vias form a cage around the inductor with an external metal layer shielding the inductor from external radiation and a metal layer within the integrated circuit close to the doped layer shields the doped layer. Unfortunately, such an arrangement has several drawbacks. Firstly, it allows interference signals to propagate within metal layers near the inductor. These signals are then capable of interfering with circuit functionality. Secondly, the method set out in U.S. Pat. No. 7,151,011 is only capable of shielding portions of the circuit within the metalized layers from the semiconductor substrate. This is not useful when RF analogue signals are being manipulated, for example amplified, using transistors and other components relying on semiconductors.

Of course, the proposed configuration in U.S. Pat. No. 7,151,011 is for shielding inductors formed exclusively within the metal layers of a semiconductor integrated circuit. It is suggested that a further ground plane, for example in the packaging, disposed adjacent the layer with the inductor be used to complete the shielding. This effectively limits the shielding capabilities significantly rendering them well suited for some applications and poorly suited for others.

One such other application is RF transceiver circuits for receiving and/or transmitting more than one signal. Such a circuit comprises a plurality of RF paths each of which can interfere with the other RF paths and each of which can be interfered with.

It would be advantageous to overcome at least some of the limitations of the prior art.

SUMMARY OF THE INVENTION

In accordance with the invention there is provided an integrated circuit comprising: a plurality of through substrate vias; and, a plurality of conductors, each coupled to one or more of the plurality of through substrate vias, the conductors in aggregate forming a segmented conductive plane, the segmented conductive plane electrically coupled for being maintained at a same potential for forming an electromagnetic shield.

In an embodiment, the through substrate vias comprises a through silicon vias.

In accordance with the invention there is provided an integrated circuit comprising: a plurality of through substrate vias disposed within the integrated circuit and spaced apart with approximately uniform spacing for shielding of known wavelengths of electromagnetic radiation, the known wavelengths relating to the approximately uniform spacing; and, a plurality of conductors, each coupled to one or more of the plurality of through substrate vias, the conductors spaced apart with approximately uniform spacing for shielding of the known wavelengths of electromagnetic radiation and in aggregate forming a segmented conductive plane, the segmented conductive plane electrically coupled for being maintained at a same potential.

In an embodiment, the through substrate vias comprises a through silicon vias.

In accordance with the invention there is provided an integrated circuit comprising: a first RF signal conditioning circuit; a second RF signal conditioning circuit; a plurality of through substrate vias disposed within the integrated circuit between the first RF signal conditioning circuit and the second RF signal conditioning circuit and spaced apart with approximately uniform spacing for shielding of known wavelengths of electromagnetic radiation, the known wavelengths relating to the approximately uniform spacing, the plurality of through substrate vias coupled for being maintained at approximately a same potential; and, at least a conductor, coupled to at least one of the plurality of through substrate vias, the at least a conductor forming one of a conductive plane and a segmented conductive plane electrically coupled for being maintained at a same potential for forming an electromagnetic shield.

In an embodiment, the through substrate vias comprises a through silicon vias.

BRIEF DESCRIPTION OF THE DRAWINGS

The invention will become more fully understood from the following detailed description, taken in conjunction with the accompanying drawings, wherein like reference numerals refer to like parts, and in which:

FIG. 5a is a simplified diagram of a transmission line formed above a segmented top metal shield;

DETAILED DESCRIPTION OF EMBODIMENTS OF THE INVENTION

Figure 1:
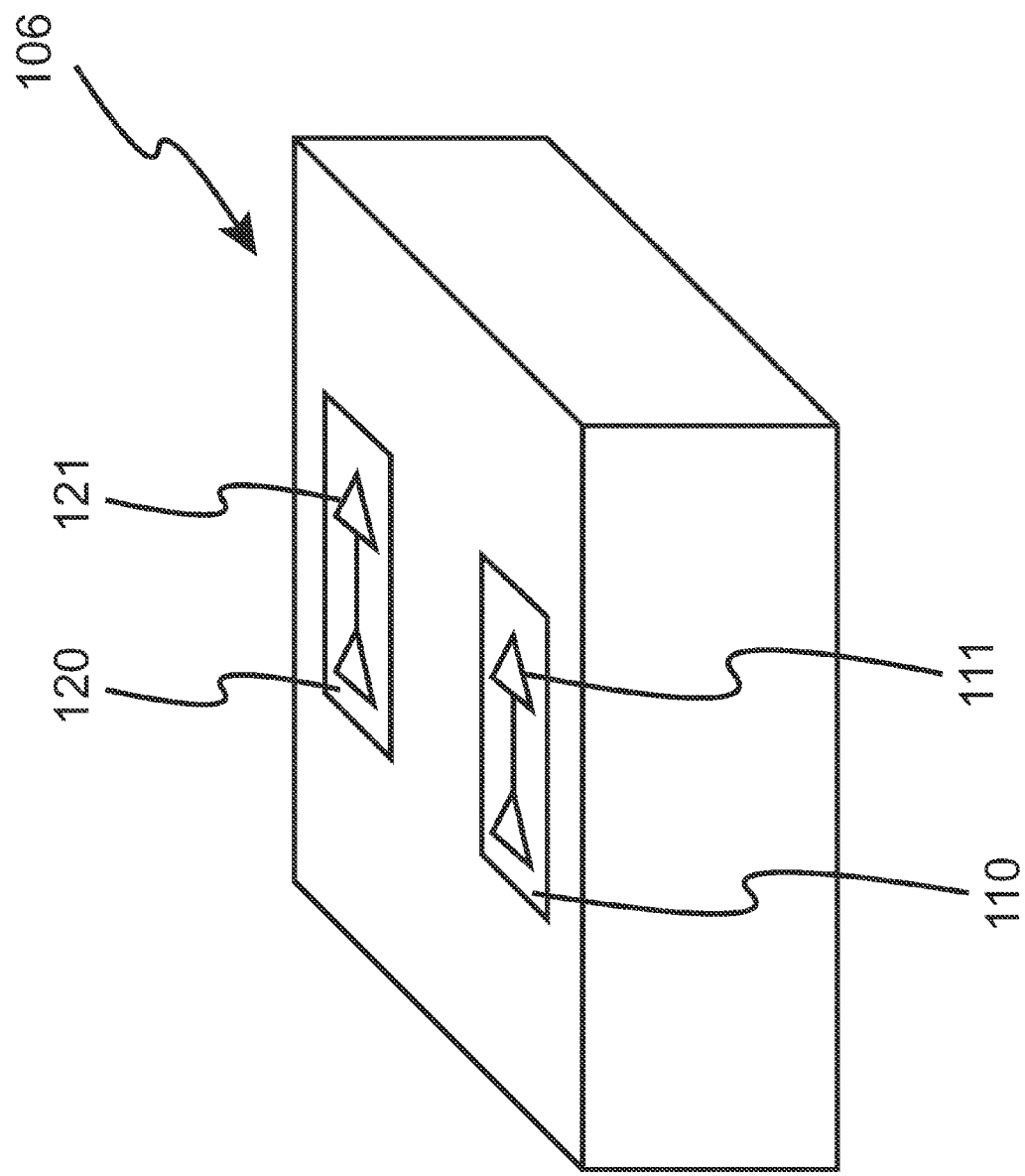
FIG. 1 is a simplified prior art diagram of an IC comprising two RF transmit paths.

Referring to FIG. 1, a simplified diagram showing an integrated circuit (IC) 100 is presented. The integrated circuit comprises two RF transmission paths 110 and 120. Each path comprises an amplifier circuit 111 and 121, respectively, relying on semiconductor transistors. The two RF transmission paths are disposed in parallel within the IC and signals propagating therein may interfere one with another. Because these signals are analogue in nature, any interference is problematic resulting in reduced performance of the RF signal path.

A technique for isolating a sensitive circuit is simply to physically distance it from the noisy circuits sharing the same substrate. The isolation can improve simply because circuit noise attenuates with distance due to parasitic effects including substrate resistance. When used in a single IC, the die size is large either limiting application to ICs having large die size or requiring larger dies than are necessary for implementing the circuit elements. Another common approach to addressing the issue of inter signal interference is to place the RF paths in separate ICs to provide sufficient electromagnetic isolation there between. Unfortunately, this increases the cost and is therefore undesirable.

Thus, when two sensitive circuits are near each other and produce unwanted noise that compromises the integrity of the others' signal or interferes with the signal processing of the other circuit and it is desired to include both sensitive circuits in a same IC, they are advantageously physically separated by a structure as described herein below.

Figure 2:
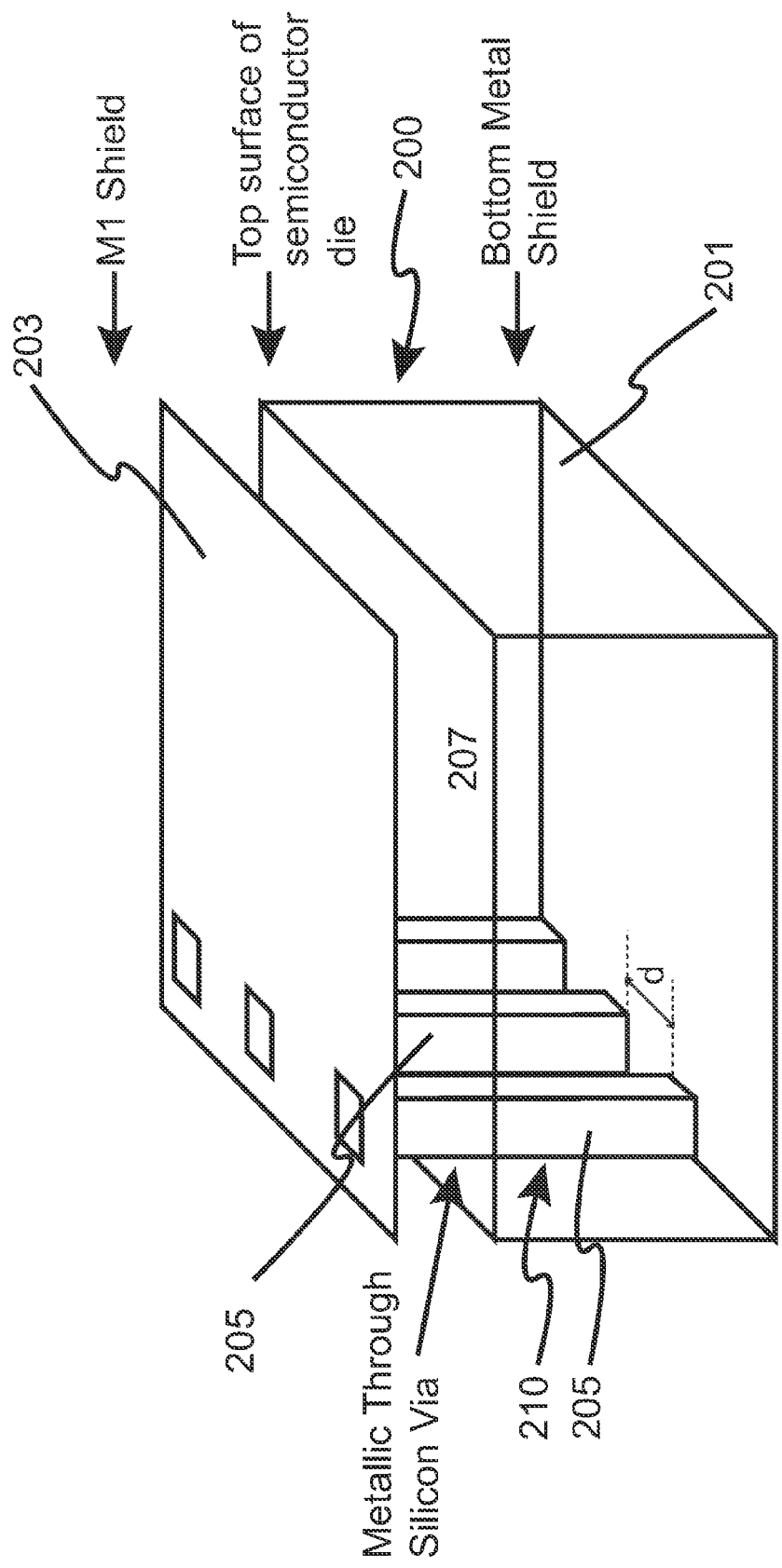
FIG. 2 is a simplified diagram of an IC comprising shielding for isolating at least part of the IC from electromagnetic radiation within a range of wavelengths.

Referring to FIG. 2, shown is a simplified diagram of an integrated circuit according to an embodiment. IC 200 is shown having a bottom metal shield—a metallic layer—201 thereunder and a second metallic layer 203 thereabove. Coupling the metal shield 201 and the metallic layer 203 are a plurality of through silicon vias 205 spaced apart a distance, d, for filtering signals of known wavelengths or within known wavelength ranges. The vias are preferably metal filled providing conductivity between layers 201 and 203, which are held at ground potential. Thus, signals at 207 within the partial Faraday cage, so formed, are shielded from other circuit elements on an outside of the cage, for example at 210. By forming vias surrounding an area, an entire three-dimensional volume within the IC is isolatable, though this is not typically necessary.

Figure 3:
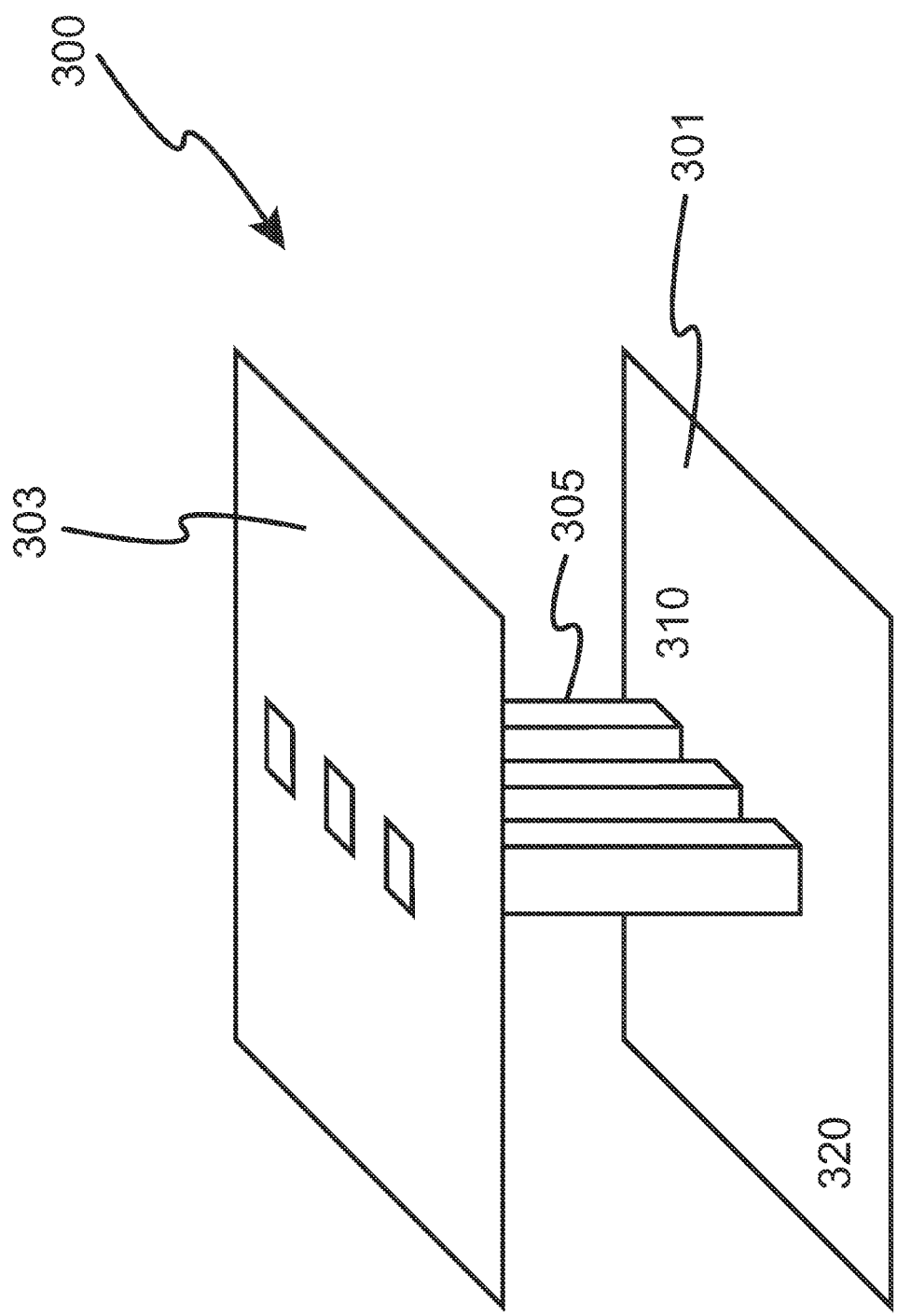
FIG. 3 is a simplified diagram of an IC comprising two RF transmit paths isolated one from another by a linear array of vias forming RF isolation provided within the IC.

Referring to FIG. 3, shown is a simplified diagram of an integrated circuit according to another embodiment. IC 300 is shown having a bottom metal shield—a metallic layer—301 thereunder and a second metallic layer 303 there above. Coupling the metal shield 301 and the metallic layer 303 are a plurality of through silicon vias 305 spaced apart a distance, d, for filtering signals of known wavelengths or within known wavelength ranges and extending across the IC approximately centrally. The vias 305 are preferably metal filled providing conductivity between layers 301 and 303, which are held at ground potential. Thus, signals within the right half 310 of the IC, are shielded from other circuit elements on a left half 320 of the IC. By forming vias 305 as a fence between two circuit paths, it is possible to isolate one circuit path from another without forming a completely shielded volume. Optionally, the packaging comprises additional shielding for shielding of the circuit from external sources of interference.

For example, if the IC 300 contains 2 or more TX transmit chains—for example, two or more RF signal power amplifiers comprising one or more stages of amplification in each chain, and the chains are operatable simultaneously, producing significant RF output power and harmonics within the IC, signals from an adjacent amplifier will, absent isolation, couple through the substrate and interact with the adjacent chain. By placing metallic, grounded vias in a one-dimensional array spaced apart by sub-wavelength spacing, the array disposed between the chains, a significant reduction in harmonic leakage results. The vias is electrically connected to a surface metal shield, and, optionally to additional metals higher in the metal stack.

It is undesirable from a manufacturing perspective to create a solid wall of metal penetrating the substrate die because of the propensity of such pattern to allow breakage of the wafers during circuit manufacturing. Prior to metal filling of a through substrate vias, the wafer is etched to create a void penetrating the wafer to a depth equal to or greater than the final die thickness. Further, extending the line of vias nearly the length and/or width of the IC in any direction is potentially problematic providing perforations resulting in decreased yields due to breakage.

It is therefore desirable to limit a number of and spacing of through silicon vias disposed linearly along a wafer surface. Further enhancement in yield is also achieved by arranging the through silicon vias other than along a cleavage plane of the wafer. Thus, by spacing the vias so that they other than form sufficiently weak lines across the wafer and by ensuring that long lines of through silicon vias are not being formed on the wafer and especially not along a cleavage plane of the wafer, increased yield is achieved.

Figure 3A:
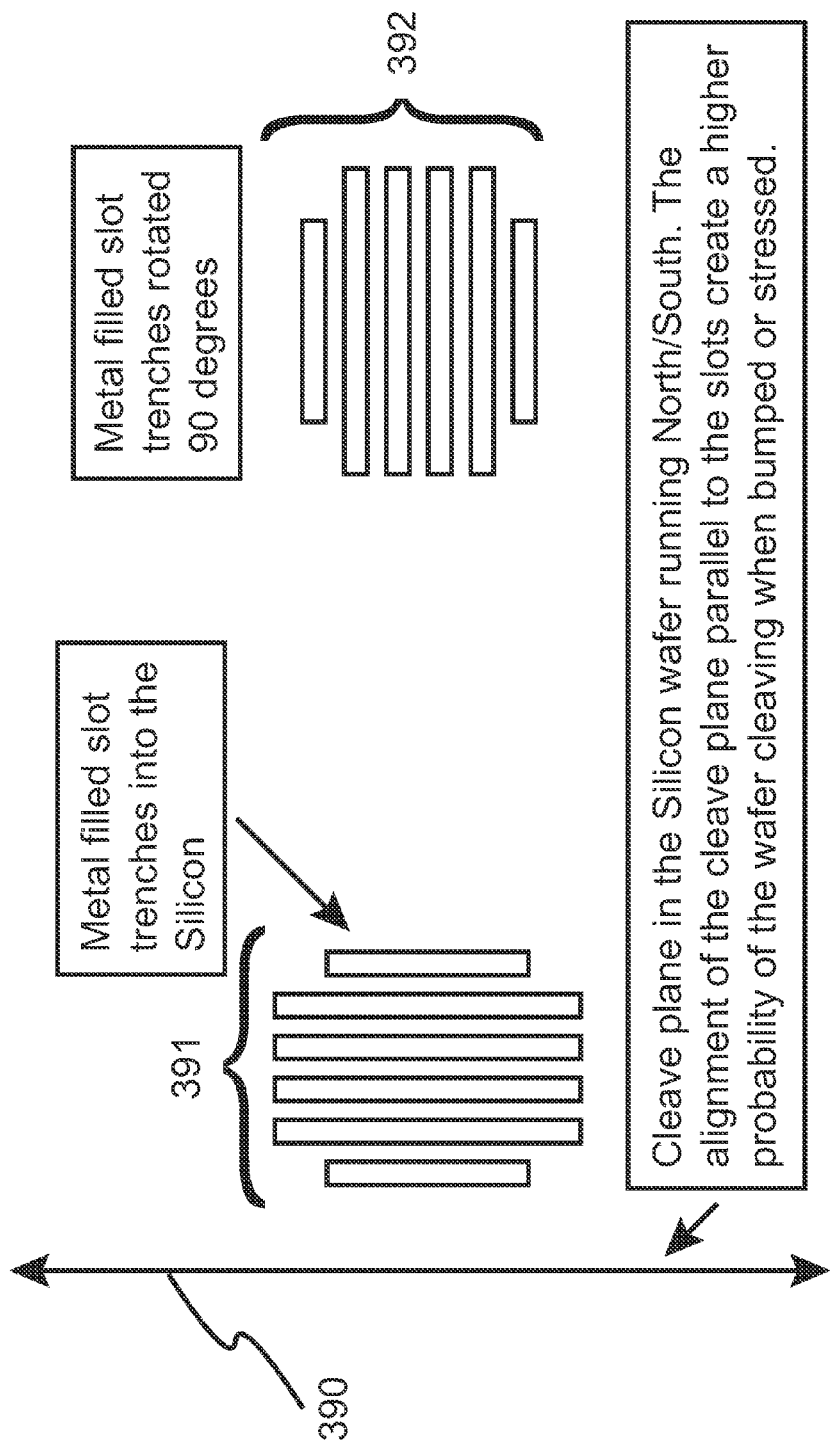
FIG. 3a is a simplified diagram showing a cleavage plane and two sets of through substrate vias that are metal filled.

Referring to FIG. 3a, shown is a simplified diagram showing a cleavage plane 390 and two sets of through silicon vias 391 and 392 that are metal filled. Vias 391 are parallel to the cleavage plane in orientation and transverse the cleavage plane in alignment. Vias 392 are transverse the cleavage plane in orientation and parallel to the cleavage plane in alignment. The vias 391 and 392 are shown rotated by 90 degrees relative to each other. As is evident, by disposing the vias at an angle to the cleavage plane other than a multiple of 90 degrees, there is less risk of damage to the integrated circuit during cleaving thereof. Alternatively, the vias are designed to limit their effect on cleaving through different placement, different shapes, different vias lengths, or through other designs limiting weakness in the integrated circuit along the cleavage plane. Of note, vias 391 and 392 are composed of long narrow trenches.

Figure 4:
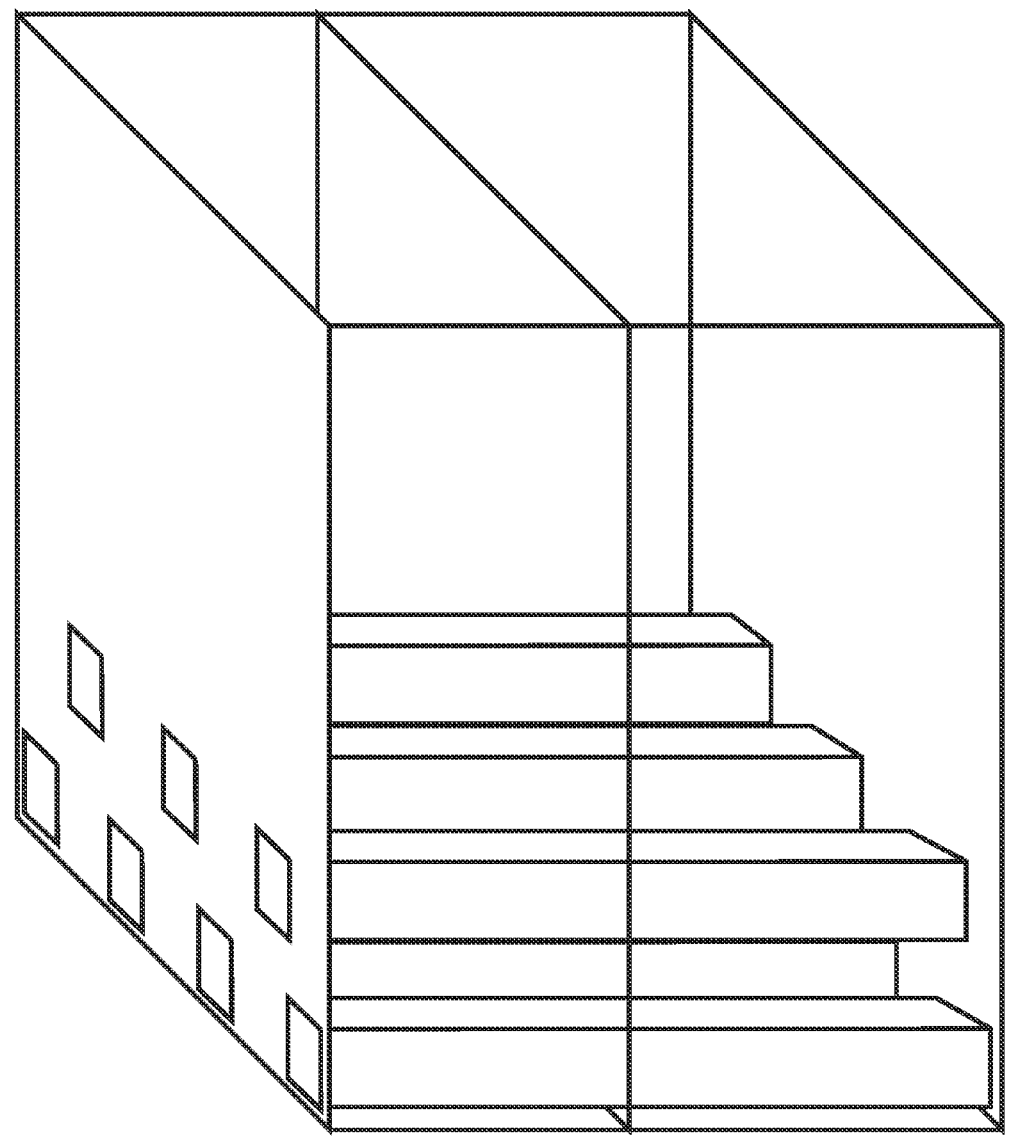
FIG. 4 is a simplified diagram of an IC comprising two RF transmit paths isolated one from another by a staggered two dimensional array of vias forming RF isolation provided within the IC.

Referring to FIG. 4, another configuration of an isolating array is shown wherein the through substrate vias 405 are disposed in a staggered two-dimensional array is shown. This is useful for improving the degree of isolation. Alternatively, this is useful for filtering further frequencies. Further alternatively, this is useful for limiting spacing between many linearly disposed through substrate vias 405 to make breakage less likely. As is evident from FIG. 4, the closely spaced through substrate vias are in groups of 2 shown diagonally disposed relative to an edge of the die. Further, expanding the embodiment of FIG. 4 to three staggered rows of vias forming diagonals, or alternatively forming a zig zag pattern is also supported. Further alternatively, curved lines of through substrate vias provide adequate shielding and to some degree are less likely to result in breakage of the wafer. Yet further alternatively, the through silicon vias are disposed at an angle relative to a surface of the wafer.

Relying on through substrate vias, which connect a metallic surface shield to the backside of the IC, which is also metalized significant isolation of the substrate layer is achievable. By spacing these vias, typically on the order of fractions of the wavelength to be isolated, significant rejection can be obtained between adjacent circuits. The full substrate depth of the vias provides a shielding effect through the entire depth of the substrate, further enhancing the effectiveness of the isolation structure. In effect, the one-dimensional array of metal vias forms one part of what is commonly know as a Faraday shield wherein outside signals having a spectral distribution within or overlapping the spectral distribution of the signal being processed or generated within the circuit cannot penetrate the shield. The shield is typically maintained at ground potential with a low AC impedance to Earth ground at the frequencies of interest and therefore acts as a RF and DC sink for such signals impinging the shield.

When only inter circuit isolation is required, a Faraday shield comprising a partial cage is often sufficient to limit or prevent interfering signals form propagating form one portion of an IC to another.

Figure 5:
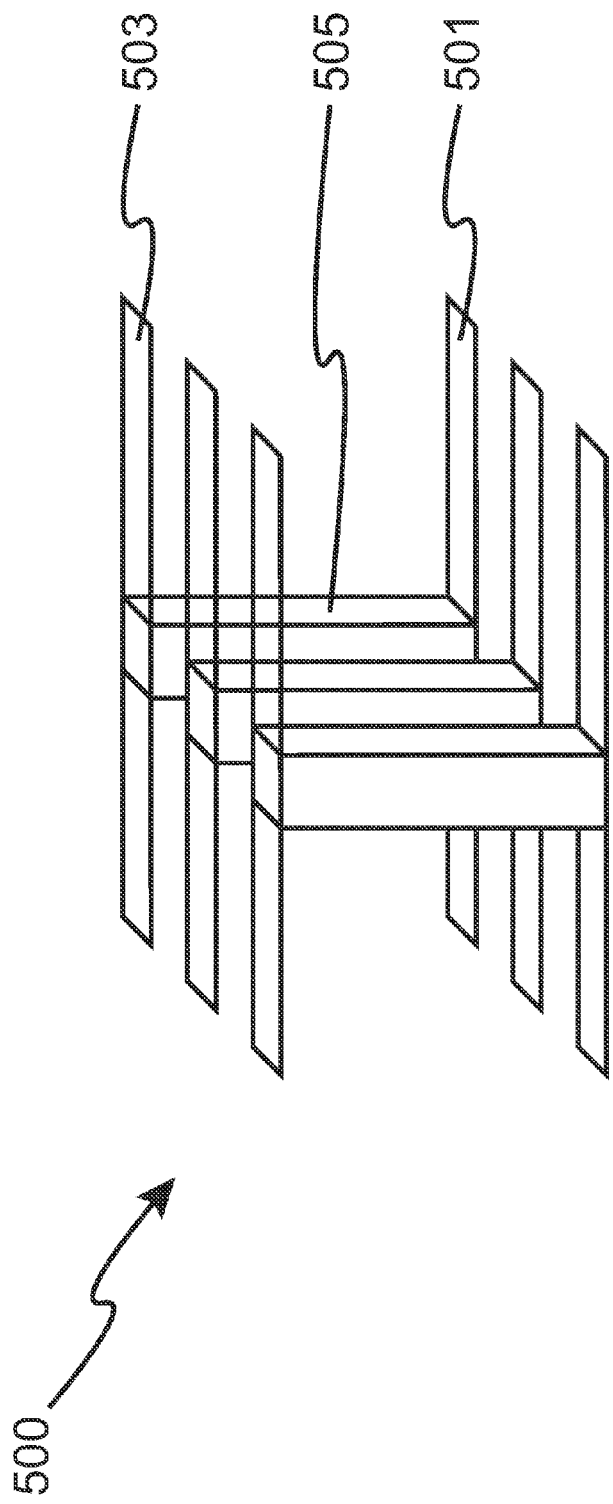
FIG. 5 is a simplified diagram of an IC comprising two RF transmit paths isolated one from another by a staggered two dimensional array of vias forming RF isolation provided within the IC and an array of linear conductive regions within a plane each electrically coupled with a vias.

A known problem with ground plane shielding is eddy currents. Eddy currents are currents that flow within conductive planes. An eddy current, also known as Foucault current, is an electrical phenomenon that is caused when a conductor is exposed to a changing magnetic field due to relative motion of the field source and conductor; or due to variations of the field with time. This can cause a circulating flow of electrons, or a current, within the conductor. These circulating eddies of current create electromagnets with magnetic fields that oppose the change of the magnetic field. The stronger the applied magnetic field, or the greater the electrical conductivity of the conductor, or the faster the field that the conductor is exposed to changes, then the greater the currents that are developed and the greater the opposing field. The term eddy current comes from analogous currents seen in water when dragging an oar breadthwise Eddy currents, like all electric currents, generate heat as well as electromagnetic forces and therefore introduce loss in transmission lines place over the ground plane in which the eddy current forms. As such, it would be advantageous in many RF applications, to limit planar ground planes forming surfaces of isolating shields. Referring to FIG. 5, an embodiment is shown wherein the top and bottom metal planes are replaced in part by non-planar shielding. An IC 500 is provided comprising a plurality of through silicon vias 505. Each vias 505 is coupled at each end thereof to a metal conductor 501 and 503, respectively. The metal conductors 501 and 503, respectively, are coupled to ground. The resulting Faraday shield is non-contiguous on each surface thereby restricting eddy current flow. A transmission line formed using such a segmented top metal shield, as shown in FIG. 5a, has less loss than when the ground shield is contiguous. In FIG. 5a, a transmission line 550 in Metal 2 is shown over metal conductors 501 and 503 in Metal 1 and forming a non-contiguous ground shield wherein each ground shield segment formed by metal conductors 501 and 503 is independently grounded using a through silicon vias to, for example, the back-side metal. Of course, it is also possible to maintain the non-contiguous conductive plane at another potential other than ground. Of course, other embodiments for restricting eddy current flow are also supported.

Surface metal shapes are also modifiable for approximately optimal eddy current reduction using electro-magnetic analysis techniques. In addition, surface eddy shields—metallic shield structures above the surface of the semiconductor die which have the purpose of restricting the flow of eddy currents—have been shown to provide a virtual ground plane for low loss transmission lines passing above the ground structures. Thus advantageously, low loss transmission lines are disposed outside the cage on a "surface thereof." The surface is preferably in the form of an eddy shield—surface metal shapes coupled to the through silicon vias and to ground for reducing eddy currents flowing in the shielding.

When asymmetric through substrate vias are used, rotation of adjacent vias by 90 degrees in alternating positions shows further reduction in losses. For example when the through substrate vias are long and thin rectangles in cross section taken parallel to the metal planes, rotating every second vias about a normal to the metal planes by 90 degrees results in improved reduction in losses.

Figure 5B:
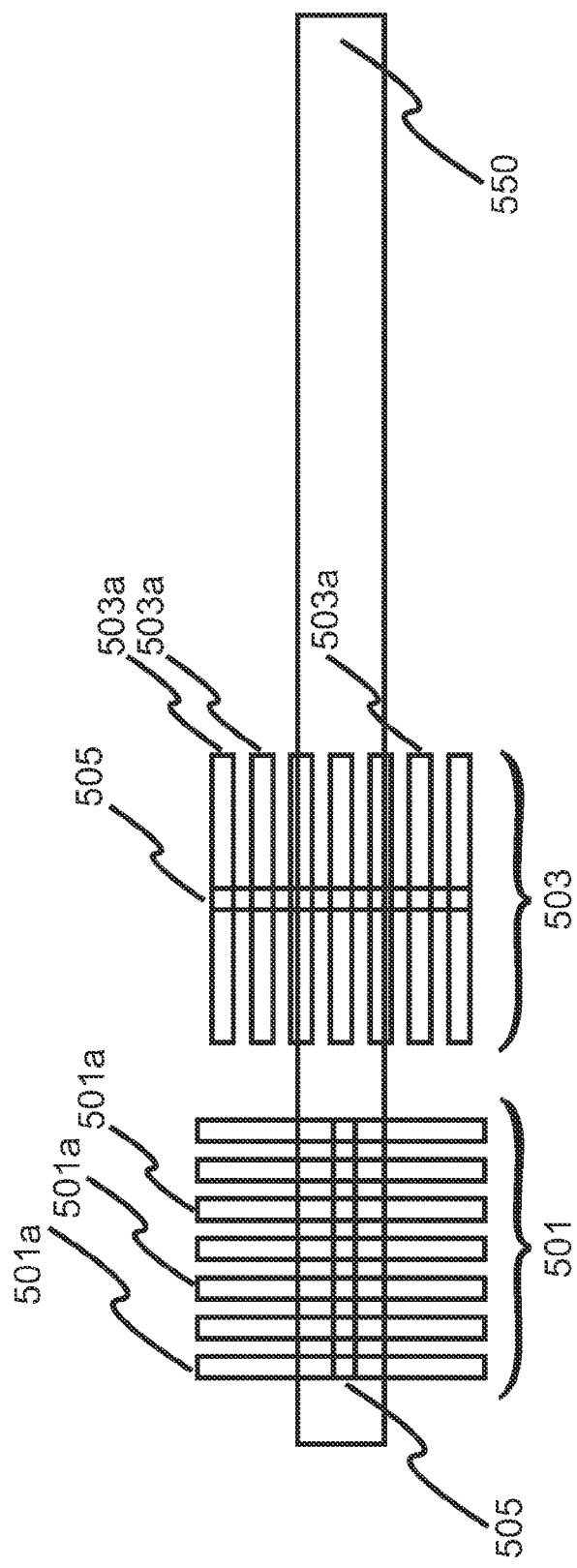
FIG. 5b is a simplified diagram of a transmission line disposed over a segmented conductive plane.

Referring to FIG. 5b, shown is transmission line 550 disposed over a segmented conductive plane, a noncontiguous conductive plane, shown at 501 and 503, respectively. Each of segmented conductive planes 501 and 503 are further segmented along a different direction, shown at 90 degrees one to another. The segmented conductive plane is coupled to one or more through substrate vias and maintained at a known potential. Optionally, different segmented conductive planes are maintained at different potentials. Within segmented conductive plane 501 are a plurality of segments 501a and within segmented conductive plane 503 are a plurality of segments 503a. Optionally for each segment 501a and 503a a direct connection to the through substrate vias there below is provided. Alternatively, a coupling to the through substrate vias there below is provided via a conductor coupling the segments. Optionally, the segmented conductive planes 501 and 503 are other than further segmented.

As is evident from FIG. 5b, through substrate vias below each of the segmented conductive planes 501 and 503 are rotated one relative to another, shown here with a 90 degree rotation. Other rotations are also supported. Typically, rotations and plane configuration are selected for providing sufficient shielding and for providing reduced transmission line losses in a transmission line when disposed above the segmented conductive plane.

In a situation where the through silicon vias are electrically isolated from the substrate, a different potential is optionally imposed on the vias. The vias remain a sink or RF signals and, with the different potential applied serve to bring other potentials to the surface region of the semiconductor die where the active circuitry is operative.

Figure 6:
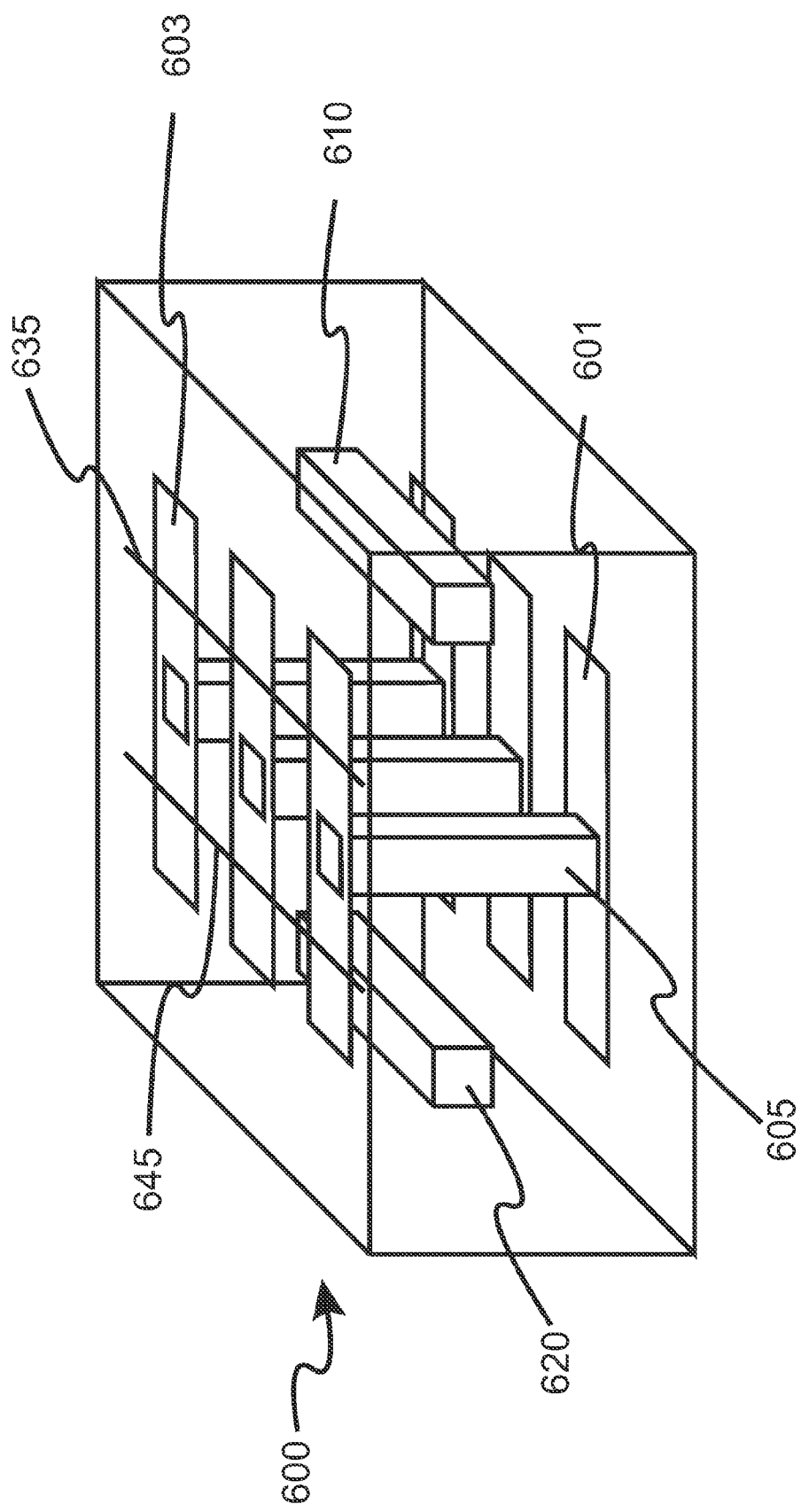
FIG. 6 is a simplified diagram of an IC comprising two RF transmit paths isolated one from another by a staggered two dimensional array of vias forming RF isolation provided within the IC and an array of linear conductive regions within a plane each electrically coupled with a vias and having a transmission line disposed thereabove in isolation from a first circuit within the IC; and, FIG. 7 is a simplified cross sectional diagram of an integrated circuit (IC).

Referring to FIG. 6, an integrated circuit 600 is shown. A plurality of through silicon vias 605 are shown coupling metal 603 on an upper surface and metal 601 on a lower surface of a shielding. Within the shielded areas are amplifier circuits 620 and 610 shielded one from another. Outside of the shielding and disposed on the upper surface 603 are two transmission lines 635 and 645. Optionally, shielding is provided between the transmission lines as well but outside the shielded areas comprising the amplifier circuits 620 and 610.

Through careful design of the metal 603 on the upper surface, an RX return path transmission line with lower loss is achieved relative to a same RX transmission line disposed on a continuous ground plane. Optionally, the metal 603 on the upper surface and/or the metal 601 on the lower surface of the shielding is formed in a mesh configuration instead of a plurality of bands surrounding or partially surrounding a shielded volume.

Figure 7:
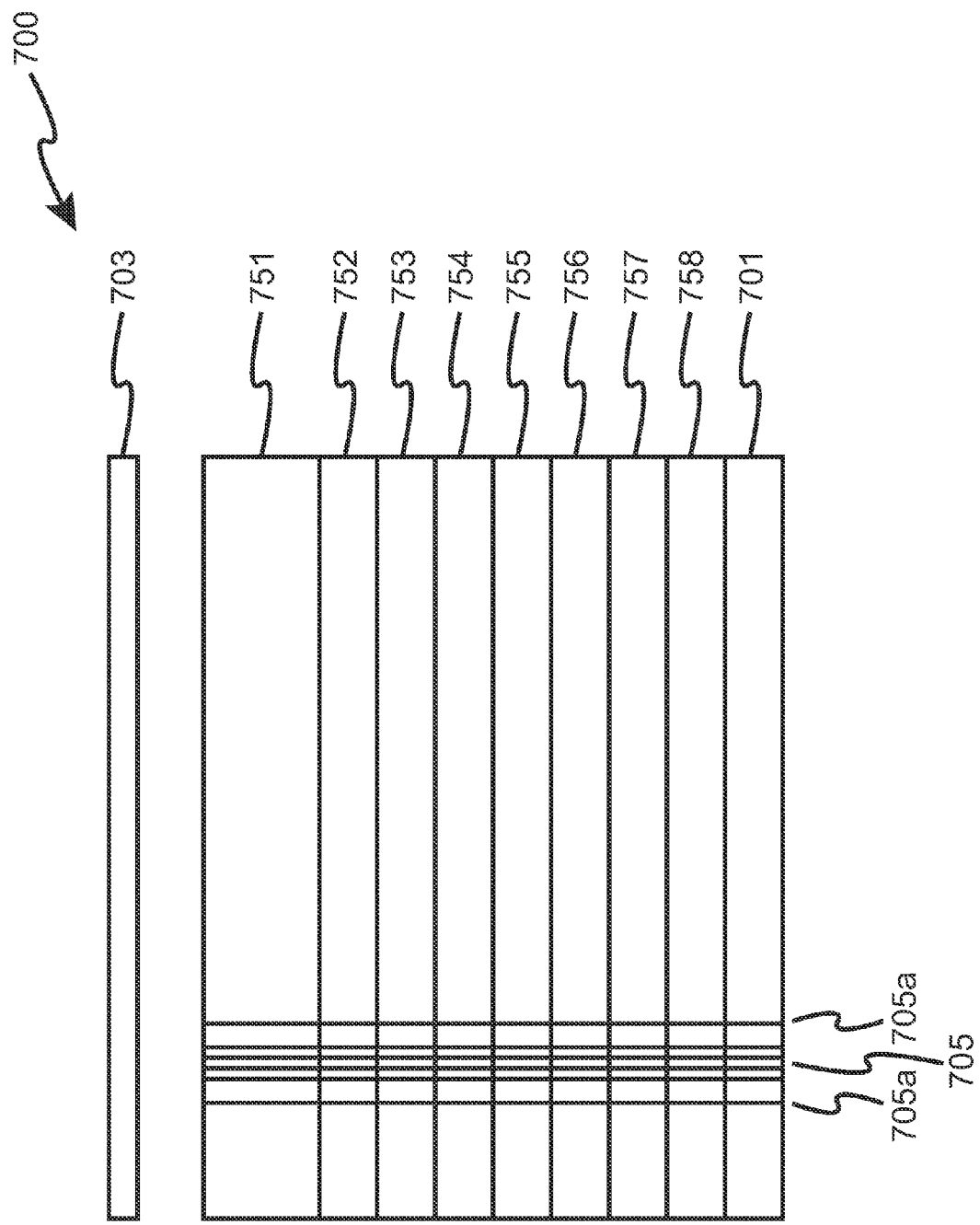

Referring to FIG. 7, shown is a simplified cross sectional vias of an IC. IC 700 comprises bottom conductive layer, metal shield, 701 and top shield 703. At least a silicon layer 751 is shown as are a series of metal and dielectric layers 752 through 758. Through the metal and dielectric layers and through the silicon layer 751 is disposed through silicon vias 703 insulated from the layers by insulation 705a provided thereabout. Through silicon vias 705 is filled with a conductive material, for example tungsten.

The substrate can be any type of substrate including a silicon-on-insulator substrate, a semiconductor substrate, a gallium arsenide (GaAs) substrate, a germanium (Ge) substrate, a thin film, or other device upon which a circuit can be fabricated. Preferably, substrate 520 is a lightly doped P-type or N-type substrate.

The metal layers within layers 752-758 comprise conductive lines arranged in various configurations patterned according to a conventional process.

A wide range of through wafer vias (twv) patterns and orientations are applicable with the above described embodiments. According to an embodiment, vias are cylindrical (e.g., rectangular or circular). Vias are arrangeable in clusters and act as columns for shield. Vias can be spaced apart from each other by a few microns to less than 100 microns. Vias spaced apart by 100 microns shield frequencies in the Gigahertz (GHz) range ($\lambda$=15 cm). The spacing can be greater for lower frequencies.

Optionally, when electromagnetic isolation is provided around an entire region, the region includes an input/output port provided through a gap in the Faraday shield. In an embodiment, the circuit comprises an input port on one side and an output port on an opposing side. For example, input port and output port are provided between vias. Preferably, structures with holes or gaps through the shielding provide adequate shielding because the dimension of those holes or gaps is significantly smaller than the wavelengths associated with the electromagnetic radiation.

Many different analogue circuits benefit from shielding according to embodiments of the invention. Circuits can provide various functions and can include any number of components. For example, a circuit comprises an oscillator. Alternatively, the circuit comprises a signal amplification and conditioning circuit for RF transmission. The circuits located on integrated circuits according to embodiments of the invention are not intended to be limited by the description hereinabove. Various types of circuits and functionality can be achieved on an integrated circuit die without departing from the scope of the invention.

Though the through substrate vias are all shown disposed in a straight line, in an alternative embodiment, the vias are disposed along curves for forming shielding. Further alternatively, the vias are formed other than normal to a plane of the bottom metal shield. Further alternatively, the vias are disposed along a serpentine pattern forming a curved zigzag pattern.

Though the term Faraday shield are used herein, it will be understood by one of skill in the art that a shield as disclosed need not form an enclosed region whether labeled a cage or a shield. It will further be understood that it may form an enclosed region. It is preferred that the Faraday shield provide some improved level of electromagnetic isolation between two portions of a same IC over the same IC absent the Faraday shield.

Numerous embodiments can be envisaged without departing from the spirit or scope of the invention.

What is claimed is:

1. An integrated circuit apparatus comprising:
a substrate including one or more metal layers and one or more dielectric layers;
a plurality of vias disposed through at least one of the one or more metal layers and at least one of the one or more dielectric layers of the substrate; and
a segmented conductive plane electrically coupled through the plurality of vias at a same potential to form an electromagnetic shield, the segmented conductive plane including a first plurality of conductive segments segmented along a first direction and a second plurality of conductive segments segmented along a second direction different from the first direction, the conductive segments of the first and second pluralities of conductive segments alternatingly arranged along a transmission line formed above the segmented conductive plane.

2. The integrated circuit apparatus of claim 1 wherein the first and second pluralities of conductive segments are disposed within a same metal layer.

3. The integrated circuit apparatus of claim 2 further comprising an integrated circuit wherein the segmented conductive plane reduces eddy currents during operation of the integrated circuit, the eddy currents reduced relative to an unsegmented conductive plane.

4. The integrated circuit apparatus of claim 1 wherein the plurality of vias are other than approximately rotationally invariant about a normal to the conductive segments of the first and second pluralities of conductive segments.

5. The integrated circuit apparatus of claim 4 wherein the plurality of vias are disposed along a first path and a portion of the plurality of vias are rotated by a rotation amount other than a multiple of approximately 180 degrees about the normal relative to unrotated vias.

6. The integrated circuit apparatus of claim 5 wherein the rotation amount is approximately 90 degrees and the rotated and unrotated vias are alternatingly disposed along the first path.

7. The integrated circuit apparatus of claim 4 wherein the each via of the plurality of vias has a rectangular cross section taken along a plane parallel to the at least one of the one or more metal layers and the at least one of the one or more dielectric layer, the rectangular cross section having a length substantially longer than a width.

8. The integrated circuit apparatus of claim 1 wherein each conductive segment of the first plurality of conductive segments is further segmented into a third plurality of segments in the first direction and each conductive segment of the second plurality of conductive segments is further segmented into a fourth plurality of segments in the second direction.

9. The integrated circuit apparatus of claim 1 wherein the same potential is a ground potential such that the segmented conductive plane forms a ground plane, and the transmission line is disposed on a side of the ground plane opposite the substrate.

10. The integrated circuit apparatus of claim 1 wherein each of the conductive segments of the first and second pluralities of conductive segments is coupled uniquely to a single via of the plurality of vias.

11. The integrated circuit apparatus of claim 1 wherein the vias couple with the conductive segments of the first and second pluralities of conductive segments within a central region of the substrate.

12. The integrated circuit apparatus of claim 1 wherein the vias couple with the conductive segments of the first and second pluralities of conductive segments proximate an end of the substrate.

13. The integrated circuit apparatus of claim 1 wherein the vias are spaced to shield known wavelengths.

14. The integrated circuit apparatus of claim 13 wherein the conductive segments of the first and second pluralities of conductive segments are spaced to shield the known wavelengths.

15. The integrated circuit apparatus of claim 1 wherein the same potential is a ground potential.

16. An integrated circuit apparatus comprising:
a substrate including one or more metal layers and one or more dielectric layers;
a plurality of vias disposed within the integrated circuit and through at least one of the one or more metal layers and at least one of the one or more dielectric layers of the substrate, and spaced apart with approximately a first uniform spacing to shield known wavelengths of electromagnetic radiation; and
a segmented conductive plane electrically coupled through the plurality of vias at a same potential to form an electromagnetic shield, the segmented conductive plane including a first plurality of conductive segments segmented along a first direction and a second plurality of conductive segments segmented along a second direction different from the first direction, the conductive segments of the first and second pluralities of conductive segments being spaced apart with approximately a second uniform spacing and alternatingly arranged along a transmission line formed above the segmented conductive plane to shield the known wavelengths of electromagnetic radiation based at least in part on the first and second approximately uniform spacings.

17. The integrated circuit apparatus of claim 16 wherein each conductive segment of the first plurality of conductive segments is further segmented into a third plurality of segments in the first direction and each conductive segment of the second plurality of conductive segments is further segmented into a fourth plurality of segments in the second direction.

18. The integrated circuit apparatus of claim 16 wherein the same potential is a ground potential such that the segmented conductive plane forms a ground plane, and the transmission line is disposed on a side of the ground plane opposite the substrate.

19. The integrated circuit apparatus of claim 18 wherein the segmented conductive plane provides reduced transmission line losses relative to an unsegmented conductive plane covering an approximately same area.

20. The integrated circuit apparatus of claim 16 wherein the same potential is a ground potential.

21. An integrated circuit apparatus comprising:
a substrate including one or more metal layers and one or more dielectric layers;
an integrated circuit disposed between a first radio frequency (RF) signal conditioning circuit and a second RF signal conditioning circuit;
a plurality of vias disposed within the integrated circuit through at least one of the one or more metal layers and at least one of the one or more dielectric layers of the substrate, and spaced apart with approximately uniform spacing to shield wavelengths of electromagnetic radiation from the first and second RF signal conditioning circuits, the wavelengths being shielded based at least in part on the approximately uniform spacing, the plurality of vias electrically coupled at approximately a same potential; and a segmented conductive plane electrically coupled through the plurality of vias at a same potential to form an electromagnetic shield, the segmented conductive plane including a first plurality of conductive segments segmented along a first direction and a second plurality of conductive segments segmented along a second direction different from the first direction, the conductive segments of the first and second pluralities of conductive segments alternatingly arranged along a transmission line formed above the segmented conductive plane.

22. The integrated circuit apparatus of claim 21 wherein the vias include through silicon vias.

\* \* \* \* \*